United States Patent
Lee et al.

(10) Patent No.: US 7,085,167 B2
(45) Date of Patent: Aug. 1, 2006

(54) METHODS FOR PROGRAMMING USER DATA AND CONFIRMATION INFORMATION IN NONVOLATILE MEMORY DEVICES

(75) Inventors: Seok-Heon Lee, Gyeonggi-do (KR); Young-Joon Choi, Gyeonggi-do (KR); Tae-Gyun Kim, Gyeonggi-do (KR)

(73) Assignee: Samsung Electronics Co., ltd. (KR)

(*) Notice: Subject to any disclaimer, the term of this patent is extended or adjusted under 35 U.S.C. 154(b) by 0 days.

(21) Appl. No.: 11/009,125

(22) Filed: Dec. 10, 2004

(65) Prior Publication Data
US 2006/0062049 A1    Mar. 23, 2006

(30) Foreign Application Priority Data
Sep. 17, 2004  (KR) .................. 10-2004-0074674

(51) Int. Cl.
*G11C 6/04* (2006.01)
*G11C 11/34* (2006.01)

(52) U.S. Cl. .................... 365/185.22; 365/185.24; 365/189.07; 365/185.17

(58) Field of Classification Search ........... 365/185.09, 365/185.17, 185.22, 185.24, 189.07, 189.09, 365/185.2; 65/189.04
See application file for complete search history.

(56) References Cited

U.S. PATENT DOCUMENTS

| | | | |
|---|---|---|---|
| 4,881,200 A * | 11/1989 | Urai | 365/189.04 |
| 5,473,563 A | 12/1995 | Suh et al. | 365/185.13 |
| 5,627,786 A * | 5/1997 | Roohparvar | 365/200 |
| 5,696,717 A | 12/1997 | Koh | 365/185.22 |
| 5,808,946 A * | 9/1998 | Roohparvar | 365/200 |
| 6,552,950 B1 * | 4/2003 | Cho et al. | 365/230.01 |
| 2003/0189860 A1* | 10/2003 | Takeuchi et al. | 365/200 |
| 2006/0015687 A1* | 1/2006 | Kim et al. | 711/128 |
| 2006/0018158 A1* | 1/2006 | Jo | 365/185.11 |

FOREIGN PATENT DOCUMENTS

| | | |
|---|---|---|
| JP | 2000-040382 | 2/2000 |
| KR | 1999-0080832 | 11/1999 |
| KR | 2003-0031652 | 4/2003 |

* cited by examiner

*Primary Examiner*—Richard Elms
*Assistant Examiner*—Alexander Sofocleous
(74) *Attorney, Agent, or Firm*—Myers Bigel Sibley & Sajovec (57) ABSTRACT

Method of programming nonvolatile memory devices are provided in which data is programmed into a first plurality of memory cells of the nonvolatile memory device. At the same time associated programming confirmation information is programmed into at least one second memory cell of the nonvolatile memory device. Then, a determination is made as to whether the data was correctly programmed into the first plurality of memory cells based on an evaluation of (1) the threshold voltage distributions of at least some of the first plurality of memory cells and (2) the threshold voltage distribution of the at least one second memory cell. Methods of resuming a data programming operation after an interruption such as a loss of power are also provided.

10 Claims, 5 Drawing Sheets

Fig. 1

-- PRIOR ART --

| Vcon | Vuser | Determine |
|------|-------|-----------|
| A | Don't care | Invalid |
| B | A | Invalid |
| B | B | Valid |

METHODS FOR PROGRAMMING USER DATA AND CONFIRMATION INFORMATION IN NONVOLATILE MEMORY DEVICES

CROSS-REFERENCE TO RELATED APPLICATIONS

This application claims priority under 35 U.S.C. § 119 from Korean Patent Application 2004-74674, filed on Sep. 17, 2004, the entire contents of which are hereby incorporated by reference.

FIELD OF THE INVENTION

The present invention relates to methods of programming data into semiconductor memory devices and, more specifically to methods of programming data into nonvolatile memory devices such as flash memory devices.

BACKGROUND OF THE INVENTION

Both volatile and nonvolatile semiconductor memory devices are known in the art. Volatile semiconductor memory devices store data so long as power is applied to the device. However, when the power is cut off, the data is lost. In contrast, with a non-volatile memory device the data will continue to be stored even after the power to the device is cut off. Examples of conventional nonvolatile memory devices include MASK Read Only Memory devices (MROM), Programmable ROM devices (PROM), Erasable and Programmable ROM devices (EPROM) and Electrically Erasable and Programmable ROM devices (EEPROM).

Most nonvolatile semiconductor memory devices may be reprogrammed to store different data. However, the operations used to erase data in, and then write or "program" new data to, nonvolatile memory devices such as MROM, PROM and EPROM devices are difficult to perform. Consequently, general users of computer or other electronic equipment that use these forms of nonvolatile memory may not be in a position to reprogram the devices to store different data. EEPROM nonvolatile memory devices, on the other hand, may be electrically erased and reprogrammed. As such, EEPROM devices are often used to store system programming code or in supplementary memory device applications where continuous or frequent reprogramming of the non-volatile memory device may be necessary. Flash EEPROM (hereinafter, referred to as a flash memory device) may have a high-integration density as compared to other conventional EEPROM devices. As such, flash memory devices are frequently used as high capacity supplemental memory devices. NAND type flash memory devices are frequently used because they may have a higher integration density as compared to NOR type flash memory devices.

Figure 1:
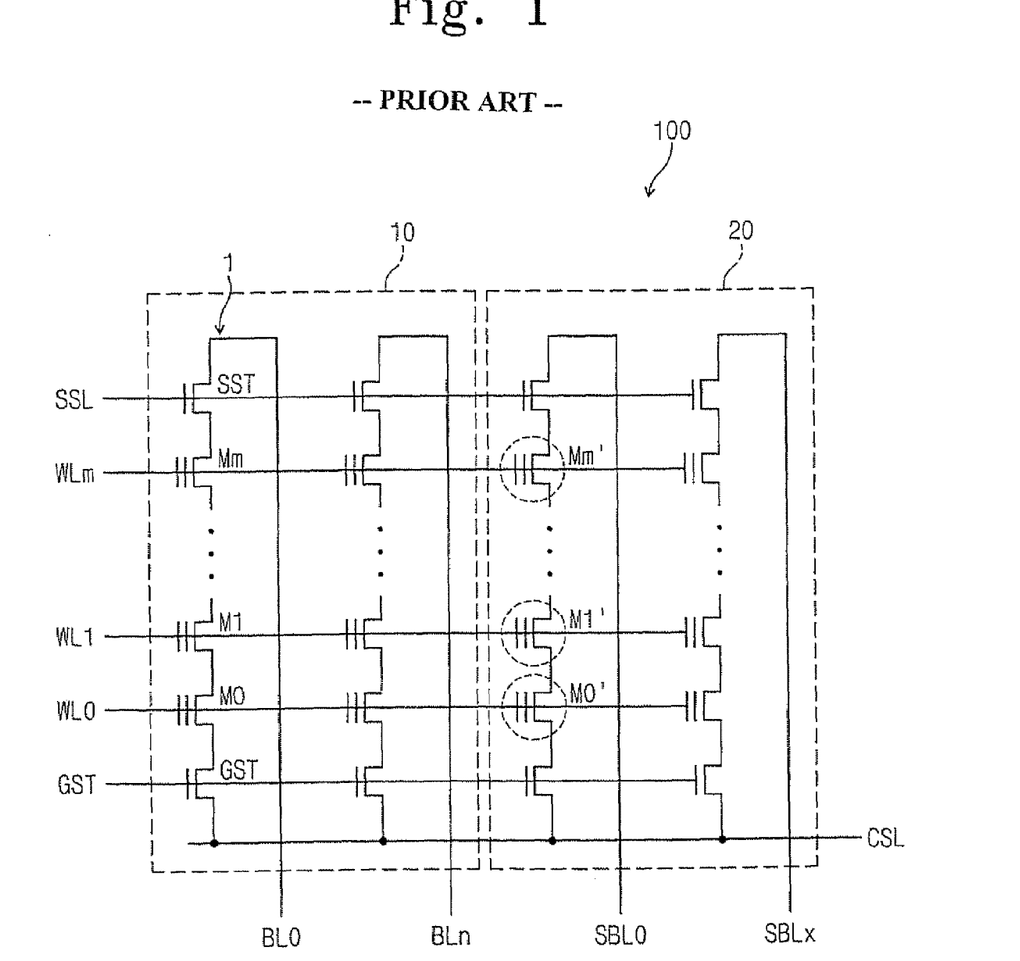
FIG. 1 depicts a cell array structure of a nonvolatile memory device.

FIG. 1 depicts the array structure 100 of a conventional NAND type flash memory device. As shown in FIG. 1, the NAND type flash memory device includes a memory cell array 100 that is used to store information (data). The memory cell array is categorized into a main region or field 10 and a spare region or field 20. While the memory cell array 100 in FIG. 1 corresponds to one memory block, typically many memory blocks are provided within a memory cell array. Information regarding the main field 10 and other general information relating to the flash memory device is stored in the spare field 20. This information may include, for example, error-correction codes, device codes, marker codes, page information and the like. The main and spare fields 10 and 20 of the memory cell array 100 comprise a plurality of cell strings 1. These cell strings may also be referred to as NAND strings.

The flash memory device may further include a page buffer circuit (not shown in FIG. 1) that may be used for programming data into the memory cell array 100 or reading data from the memory cell array 100. Typically, the memory cell of a NAND type flash memory device is erased or programmed using Fowler-Nordheim tunneling currents. Methods of erasing and programming NAND type flash EEPROM devices are disclosed, for example, in U.S. Pat. No. 5,473,563, entitled "Nonvolatile Semiconductor Memory" and U.S. Pat. No. 5,696,717, entitled "Nonvolatile Integrated Circuit Memory Devices Having Adjustable Erase/Program Threshold Voltage Verification Capability", the contents of each of which are hereby incorporated herein by reference.

To store data in the main field 10, a data loading command is applied to the flash memory device and then address information and the data that is to be stored is provided to the device. Generally, the data that is to be stored or "programmed" into the flash memory device is transmitted to the page buffer circuit in units of bytes or words in the sequence that the data is to be stored. The data stored in the page buffer circuit may be programmed into the memory cell array (i.e., memory cells of a selected page) in response to a program command.

After the memory cells of the selected page are programmed, a verification operation is performed to evaluate whether or not the memory cells of the selected page were programmed correctly. If the verification operation indicates that the memory cells of the selected page were programmed correctly, then information relating to the verification operation is programmed into a specific region (e.g., a spare field) of the device. This information indicating the results of the verification operation is called "page information" or a "confirm mark." The page information for each of the pages WL0-WLm may be stored in a specific string of the spare field 20. By way of example, in the nonvolatile memory device of FIG. 1, the page information may be stored in the string that includes the circled cells M0', M1' . . . Mm'. Thus, in the example of FIG. 1, the page information corresponding to the first page WL0 may be stored in memory cell M0' of a string connected to a spare bit line SBL0, the page information corresponding to the second page WL1 may be stored in memory cell M1' of the string connected to a spare bit line SBL0, and the page information corresponding to the last page WLm may be stored in memory cell Mm' of the string connected to a spare bit line SBL0.

As discussed above, with conventional data programming methods two data programming operations are performed to store one page of data. The first operation is the normal programming operation that is used to store the data in the memory cells of the main field 10. The second operation is the programming operation that is performed to store the page information or the confirm mark in the spare field 20, where this "page information" or "confirm mark" indicates whether or not the memory cells were correctly programmed in the main field 10. With this programming scheme, the time required to program one page of data may be twice the time required to store the information in the cells of the main field. Thus, for example, if the memory cell array includes 32 pages (or word lines), a total of 64 program operations may be required to store the 32 pages of data in the memory cell array. Thus, the above-described programming method may limit the operation speed of the flash memory device.

To speed up the operation of the device, more than one confirm mark may be programmed at a time.

Power to the flash memory device may be cut unexpectedly during programming. When the power is restored, a confirmation operation may be performed to determine whether or not the previously programming operation(s) were performed normally. This may be accomplished by checking the value programmed into the cell of the spare field that comprises the confirm mark that corresponds to a previously programmed page of the main field. However, as discussed above, the confirm mark is programmed after the user data is programmed into the main field of the device. Consequently, if the power is interrupted after the user data is programmed into the memory cells in the main field but before the confirm mark is programmed, the data programmed in the main field may be lost (i.e., may be re-programmed) even though the memory cells in the main field, were programmed correctly. This data loss may be compounded in situations where a plurality of confirm marks are programmed simultaneously.

SUMMARY OF THE INVENTION

Pursuant to embodiments of the present invention, methods are provided for programming data into a nonvolatile memory device. Pursuant to these methods, data is programmed into a first plurality of memory cells of the nonvolatile memory device and, simultaneously confirmation information that is associated with the data programmed into the first plurality of memory cells is programmed into at least one second memory cell of the nonvolatile memory device. Then, a determination is made as to whether the data was correctly programmed into the first plurality of memory cells based on an evaluation of (1) the threshold voltage distributions of at least some of the first plurality of memory cells and (2) the threshold voltage distribution of the at least one second memory cell. In these methods, the confirmation information may be a confirm mark, and the first plurality of memory cells may be in a main region of a memory cell array of the nonvolatile memory device and the at least one second memory cell may be in a spare region of the memory cell array.

In certain embodiments of the present invention, the determination as to whether the data was correctly programmed into the first plurality of memory cells may involve a first comparison of a turn-on voltage of at least some of first plurality of memory cells to a first threshold and based on a second comparison of a turn-on voltage of the at least one second memory cell to the first threshold. In certain embodiments of the present invention, a determination may be made that the data was correctly programmed into the first plurality of memory cells if the turn-on voltage of at least some of the first plurality of memory cells and the turn-on voltage of the at least one second memory cell both exceed the first threshold. In other embodiments, the determination that the data was correctly programmed may only be made if the turn-on voltage of the at least one second memory cell and the turn-on voltage of at least some of the first plurality of memory cells exceed a second threshold.

The above methods may also include determining if an interruption of power to the nonvolatile memory device occurred during the programming of data into the first plurality of memory cells and/or during the programming of the confirmation information into the at least one second memory cell. In such embodiments, a third plurality of memory cells of the nonvolatile memory device that includes at least some of the first plurality of memory cells may be scanned to identify a group of memory cells within the third plurality of memory cells that do not have a blank value.

Pursuant to additional embodiments of the present invention, methods of resuming a data programming operation in a nonvolatile memory device after an interruption are provided. Pursuant to these methods, a memory cell array of the nonvolatile memory device may be scanned to identify a memory cell that has programmed data. Then the reliability of the programmed data in the memory cell may be determined based on an analysis of both a threshold voltage of the memory cell and a threshold voltage of at least one additional memory cell that contains information regarding the reliability of the data programmed into the memory cell. Determining the reliability of the programmed data in the memory cell may be accomplished by determining if the threshold voltage of the at least one additional memory cell is larger than a first reference voltage and, if so determining if the threshold voltage of the at least one additional memory cell is larger than a second reference voltage. In some embodiments, this determination may further involve determining if the threshold voltage of the memory cell is larger than a second reference voltage.

Pursuant to still further embodiments of the present invention, methods of resuming a data programming operation in a nonvolatile memory device after an interruption are provided. Pursuant to these methods, a first group of the plurality of memory cells that appear to contain programmed data are detected, and a determination is made as to whether the threshold voltage of at least one of the first group of the plurality of memory cells exceeds a first value. If at least one of the analyzed threshold voltages is less than the first value, then the first group of the plurality of memory cells are reprogrammed.

BRIEF DESCRIPTION OF THE DRAWINGS

The accompanying drawings, which are included to provide a further understanding of the invention and which are incorporated in and constitute a part of this application, illustrate certain embodiment(s) of the invention. In the drawings.

DETAILED DESCRIPTION OF PREFERRED EMBODIMENTS

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to embodiments of the present invention, methods of simultaneously programming both data and information regarding the data (such as a confirm mark) into a nonvolatile memory device are provided. These methods may be used to program data into a main field and a spare field of a nonvolatile memory device such as, for example, a flash memory device. According to embodiments of the present invention, when a programming operation is interrupted due, for example, to a loss of power to the device, the distribution of the threshold voltage in the memory cells where the data and the confirm marks are stored may be analyzed as part of the recovery process. Based on this analysis, a determination may be made as to whether or not the corresponding memory cells were programmed "normally" or "correctly." If the analysis indicates that the corresponding memory cells were programmed normally, the programming operation is carried out starting from the next memory cell. If, on the other hand, the analysis indicates that the corresponding memory cells were not programmed normally, the abnormally programmed memory cells may be re-programmed when operations resume.

Figure 2:
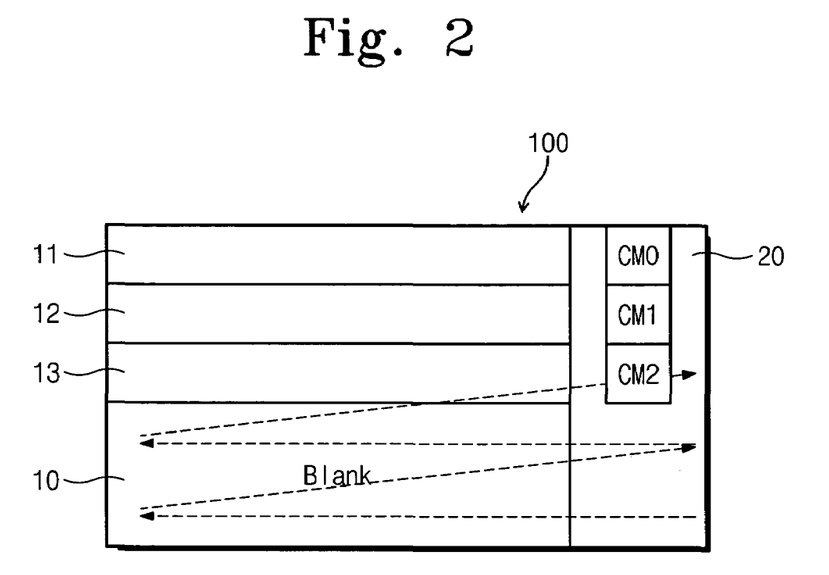
FIG. 2 depicts a cell array structure of a nonvolatile memory device in accordance with embodiments of the present invention.

FIG. 2 illustrates the memory cell array structure of a nonvolatile memory device according to embodiments of the present invention. The nonvolatile memory device of FIG. 2 comprises a NAND type flash memory device. However, it will be appreciated by those of skill in the art in light of the present disclosure that in other embodiments of the present invention the methods discussed herein may likewise be used with other semiconductor memory devices such as, for example, MROM, PROM, FRAM, and/or NOR type flash memory devices.

As shown in FIG. 2, the nonvolatile memory device may include a memory cell array 100 for storing data. The memory cell array 100 is divided into a main region 10 and a spare region 20. The main region 10 and the spare region 20 may have identical memory cell structures. User data may be programmed into the main region 10 of cell array 100 in units of pages (11, 12, 13, . . . ). Additional information corresponding to each of these pages (11, 12, 13, . . . ) may be programmed into the spare region 20. The additional information may include, for example, confirm marks (CM0, CM1, CM2, . . . ) that indicate whether or not data was correctly programmed into the corresponding pages of the main region 10. The size of the confirm marks (CM0, CM1, CM2, . . . ) may be fixed values or may be controlled according to a design. The structure of the memory cell array 100 in FIG. 2 may be identical or very similar to the memory device depicted in FIG. 1. Accordingly, the memory cell array of FIG. 2 has been designated with the same reference numerals as are used with the memory cell array of FIG. 1, and the various components of the memory cell array will not be re-described here.

According to embodiments of the present invention, methods are provided for verifying whether a data programming operation has been performed correctly. Pursuant to these methods, the spare region 20 and the main region 10 may be programmed "simultaneously." The term "simultaneously" is used herein to mean that both the spare region 20 and the main region 10 are programmed as part of the same program operation, regardless as to whether or not the individual cells are programmed at exactly the same time. This is different than the above-described conventional method of programming a flash memory device in which the main region 10 and then the spare region 20 are programmed sequentially. As a result, the programming time can be reduced by nearly half as compared to certain conventional programming methods. Moreover, as will be explained more fully hereinafter, the programming methods according to embodiments of the present invention can reduce and/or minimize the data loss that may occur when power is temporarily interrupted during a data programming operation.

In particular, pursuant to embodiments of the present invention, when power to the device is interrupted during a programming operation, one or more confirm marks are examined after the power supply is reestablished to determine at what point in the programming operation the operations should resume. As discussed above, with conventional programming methods, if the spare region 20 has not been programmed at the time at which the power interruption occurred, the corresponding data in the main region 10 is presumed lost, regardless as to whether or not the data was successfully programmed into the main region 10. In contrast, according to embodiments of the present invention, data is simultaneously programmed into the main region 10 and the spare region 20, and an analysis may be performed to determine whether or not the data programmed into the main region 10 was programmed "reliably" or "correctly." A method of determining whether or not the data was programmed reliably in the main region in accordance with embodiments of the present invention is as follows.

When power is recovered after a power interruption that occurs during a programming operation, data in the flash memory device is scanned until a data entry that is not a blank (e.g., 'FFh' or logic '1') is detected as illustrated in FIG. 2 (i.e., until the data that was programmed last is detected). Either (or both) the user data in the main region 10 or the information stored in the spare region 20 may be scanned to detect the non-blank entry. Then, the confirm mark (CM2 in the example of FIG. 2) corresponding to the memory cells containing the detected data is analyzed along with the threshold voltage of the memory cells (e.g., the threshold voltage of the memory cells corresponding to reference number 13 in FIG. 2) to determine whether or not the memory cells 13 were programmed correctly. The above-described data scan may be performed sequentially through the memory cells, or a plurality of memory cells may be scanned at the same time using, for example, wired-OR techniques.

Generally, a nonvolatile memory device is covered by an insulation layer. The device may further include a floating gate disposed between a source and a drain, as well as a control gate that is connected to a word line. Charge carriers (i.e., electrons) are injected into the floating gate through the insulation layer during the operation to program data into a cell of the memory device. As the electrons are accumulated in the floating gate, the effective threshold voltage of the cell transistor increases to move a distribution of the threshold voltage from left to right.

When a read voltage Vread (corresponding to Vver1 in FIG. 3) of, for example, 0 volts is applied to the control gate and the drain of the cell transistor, the programmed cell remains non-conductive and indicates a logic state of '0' (OFF cell). However, after a programming operation is completed, the threshold voltage is distributed in the region labeled "B" in FIG. 3, as opposed to the region "A" which approaches 0 volts. As a result, it may be difficult to correctly decide whether the corresponding memory cell had been correctly programmed using the above data read scheme after the power is recovered. According to embodiments of the present invention, the read voltage may be used as a first program verify voltage Vver1 and a voltage of, for example, about 1.2 volts, which corresponds to approximately the minimum value of the "B" region may be used as a second program verify voltage Vver2 in order to determine the reliability of the data programmed into the memory cell. As discussed herein, similar or identical methods may be used for evaluating the reliability of programming operations that are performed to program both user data and confirm marks.

When a page (or data) that is not a blank is detected by the scanning process, a specific first program verify voltage Vver1 may be applied to the gate of a cell transistor that stores a confirm mark and a determination is made as to whether the cell transistor remains in a non-conductive state. If the cell transistor is maintained in the non-conductive state, the confirm mark is judged to be programmed. This indicates that the threshold voltage Vcon of the cell transistor storing the confirm mark is distributed in either the region "A" or the region "B" of FIG. 3.

Figure 3:
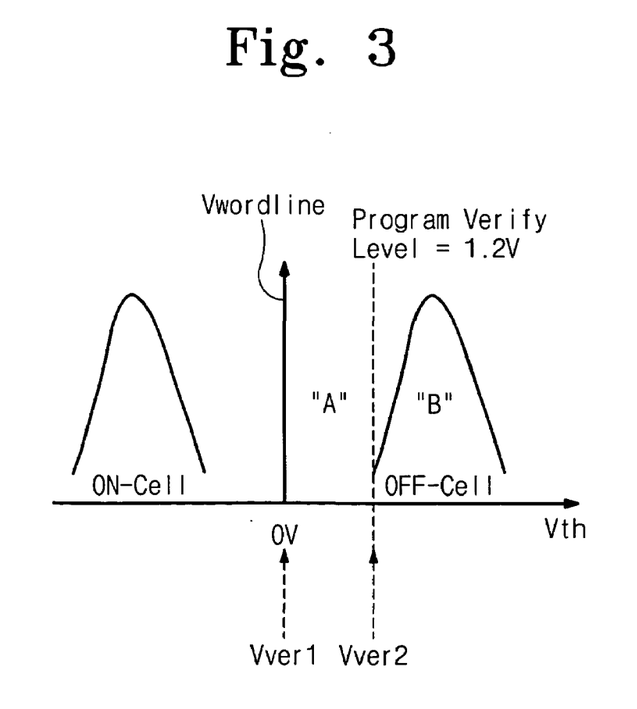
FIG. 3 is a graph illustrating a threshold voltage distribution for memory cells of a nonvolatile memory device.

Next, a specific second program verify voltage Vver2 may be applied to the cell transistor and a second determination is made as to whether the cell transistor remains in a non-conductive state. If it does, this indicates that the confirm mark is not only programmed, but programmed reliably. In this case, the threshold voltage Vcon of the cell transistor storing the confirm mark is distributed in the region "B" which; as shown in FIG. 3, is a region having a voltage that is higher than the second program verify voltage Vver2. If the confirm mark is judged to be reliably programmed, the program reliability of the user data may then be evaluated.

To determine whether the user data was reliably programmed, the first program verify voltage Vver1 may be applied to the gates of the cell transistors which store the user data and a determination is made as to whether the corresponding cell transistors are conducive or non-conductive. If a corresponding cell transistor is conductive, this indicates that the cell is not programmed, but instead is maintained in an erase state (i.e., to have a data value "1"). If, instead, the corresponding cell transistor is non-conductive, the cell transistor is judged to be in a programmed state (i.e., programmed as a value "0"). When the corresponding cell is determined to be programmed, a threshold voltage Vuser of the cell transistors is distributed in either the region "A" or the region "B" of FIG. 3 depending on whether the corresponding program is normally completed.

If the cell containing the user data is found to be programmed, a second operation may be performed to determine whether or not the programming operation was completed normally. To accomplish this, the second program verify voltage Vver2 may be applied to the cell transistor and a determination may be made as to whether the corresponding cell transistor is maintained in the non-conductive state. If so, the user data is judged to be reliably programmed. In this case, a threshold voltage Vuser of the cell transistors storing the user data is distributed in the region "B" of FIG. 3 which is a region in which the voltage is higher than the second program verify voltage Vver2.

Figure 4:
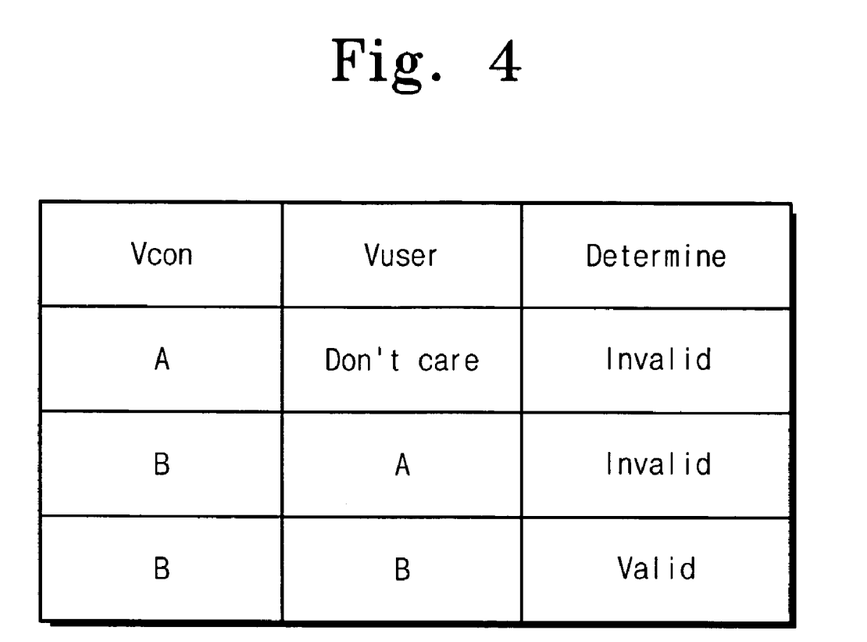
FIG. 4 is a chart that illustrates a decision tree according to embodiments of the present invention for determining whether data stored in memory cells of a nonvolatile memory device has been programmed correctly.

As illustrated in FIG. 4, if the threshold voltages Vcon of the transistor(s) storing the confirm mark and the threshold voltages Vuser of the transistors storing the user data are all distributed in the "B" region of FIG. 3 (which region has a voltage that is higher than the second program verify voltage Vver2), the confirm mark and the user data are determined to be programmed reliably. This scheme of determining the reliability of programming operations may reduce data loss that may occur when a power interruption occurs during the programming operation. In addition, according to embodiments of the present invention, the reliability of the programming may be considered with respect to both the confirm mark and the data, such that the data reliability can be improved further.

Figure 5:
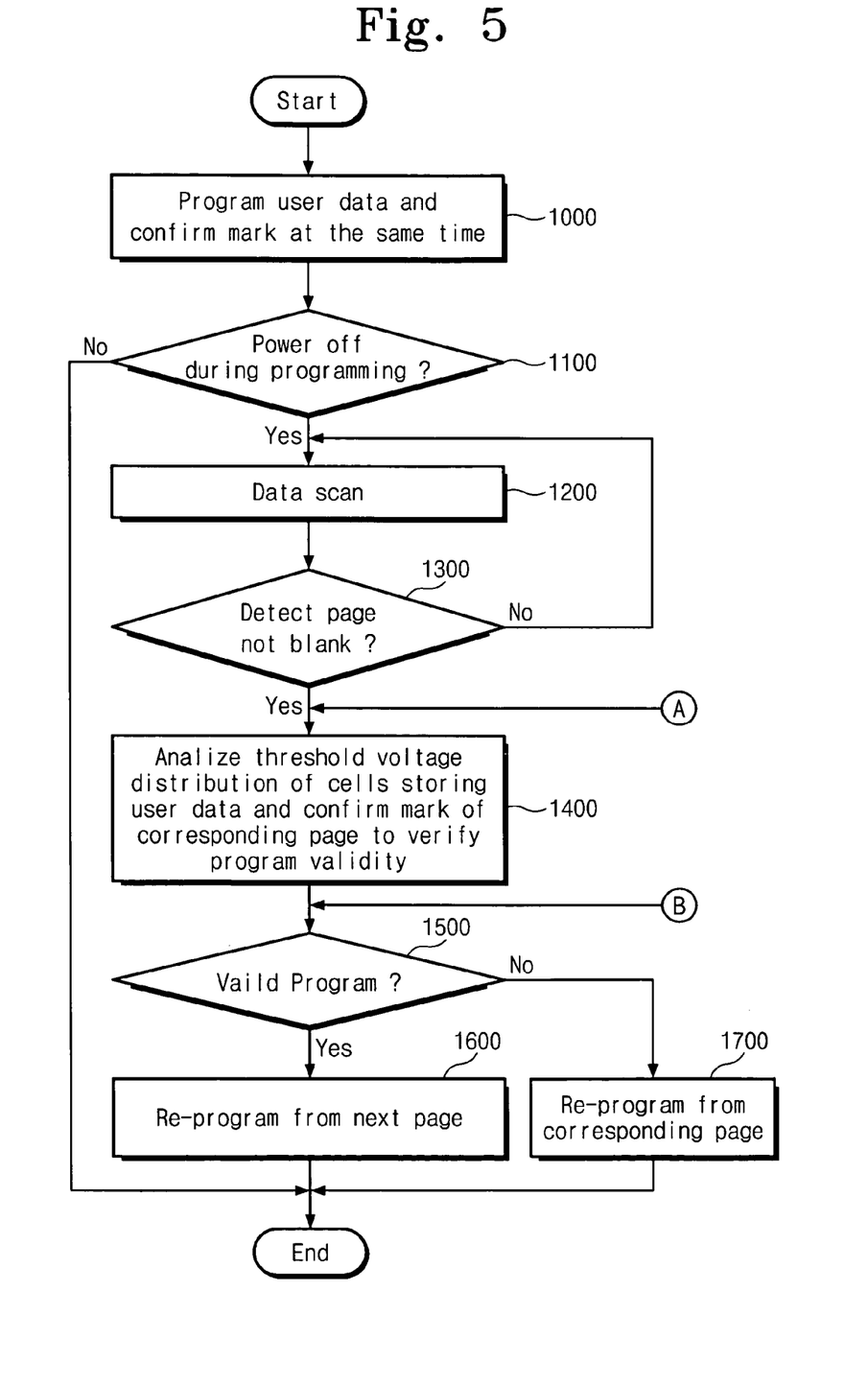
FIG. 5 is a flowchart illustrating a method of programming a nonvolatile memory device in accordance with an exemplary embodiment of the present invention.

FIG. 5 is a flow chart of a method of programming a nonvolatile memory device in accordance with an exemplary embodiment of the present invention. As shown in FIG. 5, the method of programming the nonvolatile memory device may begin with both the user data and a confirm mark corresponding to the user data being programmed at the same time (step 1000). As discussed above, the user data may be programmed in a main region of the memory cell array by units of pages. The confirm mark may be programmed in a spare region of the memory cell array and may be used as an indicator as to whether corresponding pages in the main region of the memory cell array were programmed reliably.

Next, at step 1100, a determination is made as to whether the power was interrupted during the programming operation. If so, the data stored in the memory cell array is scanned after the power is recovered (step 1200). As shown at step 1300 of FIG. 5, this scan of the data may be performed to detect memory cells which include data (i.e., cells which are not blank). The operations in steps 1200 and 1300 of FIG. 5 may be repeated until a memory cell with programmed data is detected. If memory cells containing programmed data are detected in step 1300, the threshold voltage distribution of the memory cells which store a confirm mark and the memory cells which store user data of a page where the detected data belongs is analyzed (step 1400).

Based on the analysis of step 1400, a determination is then made as to whether or not the user data in these memory cells was programmed correctly or reliably (step 1500). If the results of step 1500 indicate that the programming operation that programmed the user data to the corresponding page was performed reliably (i.e., the data is valid), operations resume with programming the data of the next page to be programmed (step 1600). If instead the results of step 1500 indicate that the programming operation was not performed reliably, operations resume with re-programming the data of the corresponding page (step 1700).

Figure 6:
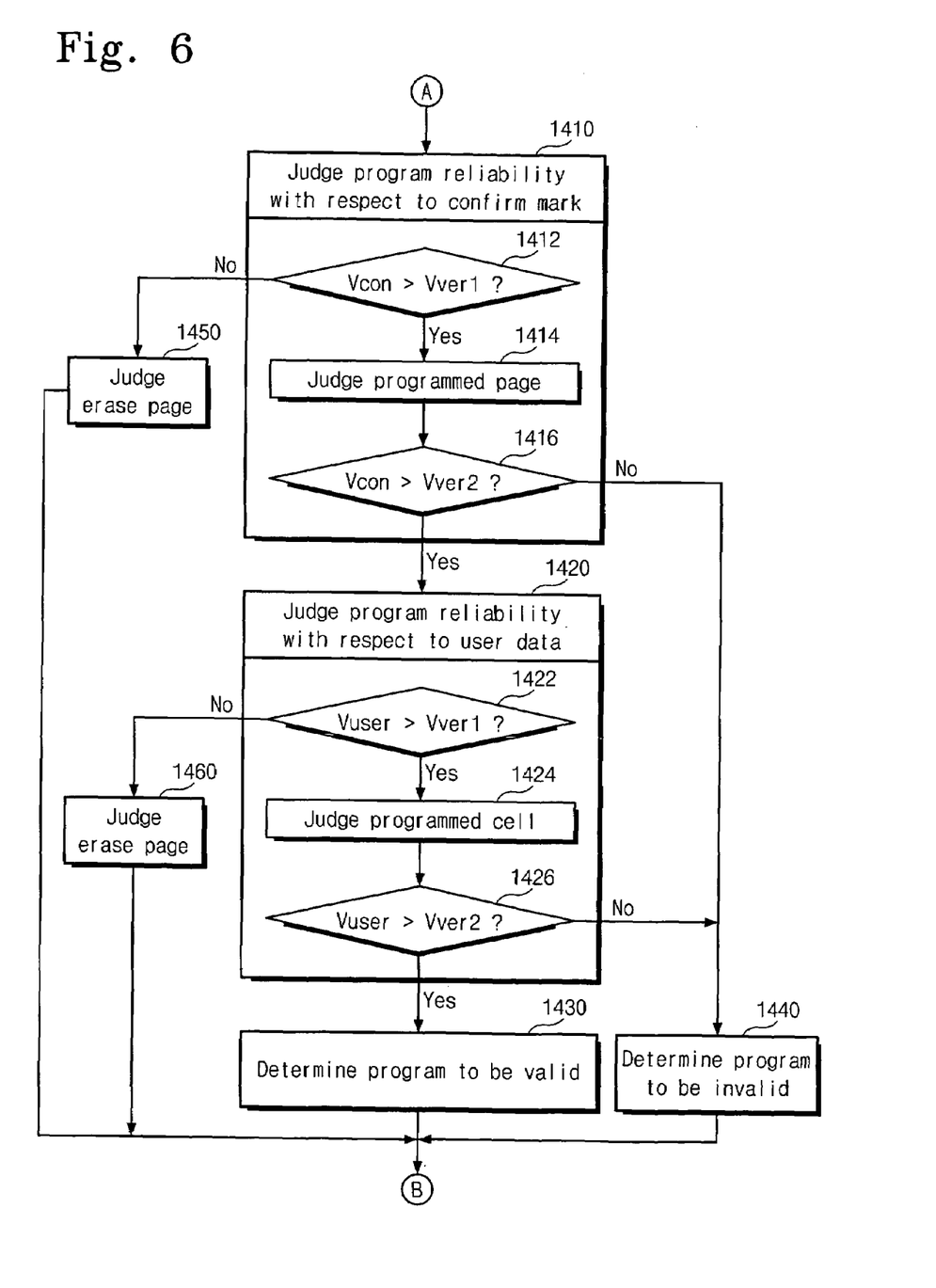
FIG. 6 is a flowchart illustrating a method of analyzing the threshold voltage distribution of cells in a non-volatile memory device according to an exemplary embodiment of the present invention.

FIG. 6 is a flow chart illustrating a method of determining whether data was programmed reliably in accordance with an exemplary embodiment of the present invention. The method of FIG. 6 may be used, for example, to perform the operations of step 1400 of FIG. 5.

As shown in FIG. 6, operations may begin with several steps which may be used to evaluate the reliability of a confirm mark (step 1410). In particular, at step 1412, a threshold voltage Vcon of the cell that contains the confirm mark may be evaluated to determine if it is larger than the first program verify voltage Vver1. If the threshold voltage Vcon is smaller than the first program verify voltage Vver1, the page corresponding to the confirm mark is considered to be an erased page (i.e., a page that has not been programmed), and the process ends (step 1450). If, instead, the threshold voltage Vcon is larger than the first program verify voltage Vver1, the page corresponding to the confirm mark is considered to be a programmed page (step 1414).

If at step 1414 the corresponding page is found to be programmed, the threshold voltage Vcon may next be compared to a larger, second program verify voltage Vver2 (step 1416). If the threshold voltage Vcon is larger than the second program verify voltage Vver2, the confirm mark is confirmed to be programmed reliably. If the threshold voltage Vcon is smaller than the second program verify voltage Vver2, it is determined that the corresponding page is not reliably programmed (step 1440).

If the confirm mark is judged to be reliably programmed in step 1416, the reliability of the user data programmed in the corresponding page may then be evaluated (step 1420). To simplify the description of this step, the process of determining the reliability of programmed user data in step 1420 is explained with respect to a single cell. It will be appreciated, however, that the process discussed below may be repeated for some or all of the cells in the page.

First, the threshold voltage Vuser of the cell is evaluated to confirm that Vuser is larger than the first program verify voltage Vver1 (step 1422). If the threshold voltage Vuser is smaller than the first program verify voltage Vver1, the corresponding cell is determined to be an erase cell, that is, a cell having a data value of "1" (step 1460), and the process is completed. If the threshold voltage Vuser is larger than the first program verify voltage Vver1, the corresponding cell is determined to be a programmed cell, that is, a cell having a data value of "0" (step 1424).

If the corresponding cell is determined to be programmed, then a determination is made as to whether the threshold voltage Vuser is larger than the second program verify voltage Vver2 (step 1426). If so, the cell is determined to be programmed reliably (step 1430). If instead the threshold voltage Vuser is smaller than the second program verify voltage Vver2, the corresponding cell is determined to be programmed unreliably (step 1440).

It will be appreciated that numerous modifications may be made to the above-described programming methods without departing from the scope or spirit of the present invention. For example, determinations regarding the reliability of programmed data may be made based solely on a comparison with the second program verify voltage Vver2.

The above-discussed steps in which the reliability of the programming of cells is determined may be individually carried out in each cell or collectively using, for example, wired-OR techniques. If it is determined that any cell from the plurality of cells belonging to the page is unreliable, the corresponding page may be re-programmed.

As discussed above, methods of programming nonvolatile memory devices are provided in which a plurality of data and programming confirmation information are programmed simultaneously. When the programming operation is interrupted by a power cut or the like, the degree to which the programming operation has been completed can be determined based on the threshold voltage distributions of (1) the memory cells that store the user data and (2) the memory cells storing the programming confirmation information (e.g., a confirm mark). Based on the results of this determination, the data that has not been correctly programmed may be identified and re-programmed. As the confirm marks may be programmed simultaneously with the user data, the overall programming time required by the methods of embodiments of the present invention may be reduced as compared to other conventional programming methods. Additionally, data loss may be reduced as compared to such conventional methods when power is recovered after an interruption in power occurs during a programming operation.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of programming a nonvolatile memory device, the method comprising:
   programming data into a first plurality of memory cells of the nonvolatile memory device;
   simultaneously programming confirmation information that is associated with the data programmed into the first plurality of memory cells into at least one second memory cell of the nonvolatile memory device; and
   determining if the data was correctly programmed into the first plurality of memory cells based on an evaluation of a threshold voltage distributions of at least some of the first plurality of memory cells and a threshold voltage distribution of the at least one second memory cell.

2. The method of claim 1, wherein determining if the data was correctly programmed into the first plurality of memory cells based on an evaluation of the threshold voltage distributions of at least some of the first plurality of memory cells and the threshold voltage distribution of the at least one second memory cell comprises determining if the data was correctly programmed into the first plurality of memory cells based on a first comparison of a turn-on voltage of at least some of first plurality of memory cells to a first threshold and based on a second comparison of a turn-on voltage of the at least one second memory cell to the first threshold.

3. The method of claim 2, wherein the confirmation information comprises a confirm mark.

4. The method of claim 2, wherein the first plurality of memory cells are in a main region of a memory cell array of the nonvolatile memory device and wherein the at least one second memory cell is in a spare region of the memory cell array.

5. The method of claim 2, wherein determining if the data was correctly programmed into the first plurality of memory cells based on a first comparison of a turn-on voltage of at least some of first plurality of memory cells to a first threshold and based on a second comparison of a turn-on voltage of the at least one second memory cell to the first threshold comprises:
   determining if the turn-on voltage of the at least one second memory cell exceeds the first threshold; and
   determining if the turn-on voltage of at least some of the first plurality of memory cells exceeds the first threshold.

6. The method of claim 5, wherein determining if the data was correctly programmed into the first plurality of memory cells based on a first comparison of a turn-on voltage of at least some of first plurality of memory cells to a first threshold and based on a second comparison of a turn-on voltage of the at least one second memory cell to the first threshold further comprises:
   determining if the turn-on voltage of the at least one second memory cell exceeds a second threshold; and
   determining if the turn-on voltage of at least some of the first plurality of memory cells exceeds the second threshold.

7. The method of claim 6, wherein the data programmed into the first plurality of memory cells is only determined to be correctly programmed if the turn-on voltage of the at least one second memory cell exceeds the second threshold and the turn-on voltage of the at least some of first plurality of memory cells exceeds the second threshold.

8. The method of claim 2, further comprising determining if an interruption of power to the nonvolatile memory device occurred during the programming of data into the first plurality of memory cells and/or during the programming of the confirmation information that is associated with the data programmed into the first plurality of memory cells into the at least one second memory cell.

9. The method of claim 8, further comprising scanning a third plurality of memory cells of the nonvolatile memory device that includes at least some of the first plurality of memory cells to identify a group of memory cells within the third plurality of memory cells that do not have a blank value.

10. The method of claim 2, wherein the data programmed into the first plurality of memory cells of the nonvolatile memory device comprises a page of data.

* * * * *